United States Patent [19]
David

[11] Patent Number: 6,015,597
[45] Date of Patent: *Jan. 18, 2000

[54] METHOD FOR COATING DIAMOND-LIKE NETWORKS ONTO PARTICLES

[75] Inventor: Moses M. David, Woodbury, Minn.

[73] Assignee: 3M Innovative Properties Company, St. Paul, Minn.

[ * ] Notice: This patent issued on a continued prosecution application filed under 37 CFR 1.53(d), and is subject to the twenty year patent term provisions of 35 U.S.C. 154(a)(2).

[21] Appl. No.: 08/979,072

[22] Filed: Nov. 26, 1997

[51] Int. Cl.⁷ .......................... C23C 16/50; C23C 16/26; B22F 1/02
[52] U.S. Cl. .......................... 427/577; 427/212; 427/215; 427/216; 427/222; 427/122; 427/249.7; 427/600; 427/906
[58] Field of Search .................... 427/577, 212, 427/215, 216, 122, 222, 249, 600, 249.7, 906

[56] References Cited

U.S. PATENT DOCUMENTS

| | | | |
|---|---|---|---|
| 4,806,246 | 2/1989 | Nomura | 210/651 |
| 4,859,493 | 8/1989 | Lemelson | 427/45.1 |
| 5,080,975 | 1/1992 | Komaki et al. | 428/404 |
| 5,156,885 | 10/1992 | Budd | 427/70 |
| 5,234,529 | 8/1993 | Johnson | 156/345 |
| 5,418,062 | 5/1995 | Budd | 428/403 |
| 5,436,036 | 7/1995 | Shiomi et al. | 427/575 |
| 5,439,705 | 8/1995 | Budd | 427/212 |
| 5,556,521 | 9/1996 | Ghanbari | 204/192.32 |

FOREIGN PATENT DOCUMENTS

| | | |
|---|---|---|
| 361 542 A1 | 12/1986 | European Pat. Off. . |
| 0 448 227 | 9/1991 | European Pat. Off. . |
| 2 760 755 | 9/1998 | France . |
| 41 22 834 A1 | 1/1993 | Germany . |
| 59-137311 | 8/1984 | Japan . |
| 63-270394 | 11/1988 | Japan . |
| 3-040953 | 2/1991 | Japan . |
| 4-304290 | 10/1992 | Japan . |
| 6-184533 | 7/1994 | Japan . |
| 6-299146 | 10/1994 | Japan . |
| 8-176540 | 7/1996 | Japan . |
| 8-319483 | 12/1996 | Japan . |
| WO 97/46484 | 12/1997 | WIPO . |
| WO 98/20185 | 5/1998 | WIPO . |

OTHER PUBLICATIONS

David M., Padiyath, R., Babu, S.V., Plasma Deposition and Etching of Diamond–Like Carbon Films, vol. 37, No. 3 AICHE Journal (Mar., 1991) pp. 367–376.

Silva, S.R.P., et al, "Diamond–Like Carbon Thin Film Deposition Using A Magnetically Confined R.F. PECVD System", Diamond and Related Materials, vol. 4, No. 7, May 15, 1995, pp. 997–983.

Chia–Fu Chen et al, "Microwave Plasma Chemical Vapour Deposition of Diamond: Its growth and characterization",: Surface and Coatings Technology, vol. 43–44, No. 1–3, pp. 53–62, Dec. 5, 1990.

*Primary Examiner*—Roy V. King
*Attorney, Agent, or Firm*—Melanie Gover

[57] ABSTRACT

A method for making particles coated with a diamond-like network, which can include additive components. The method comprises subjecting a multiplicity of particles to a carbon-based plasma in an evacuated radio frequency powered capacitively coupled reactor system in which ion sheaths are formed around the electrodes and wherein the particles are agitated in such a manner as to expose their surfaces to the reactive species in the plasma while keeping the particles substantially within an ion sheath.

The advantages of the present invention include (i) the efficient deposition of DLN onto particles at high deposition rates, (ii) the deposition of densely-packed DLN coatings, (iii) the ability to perform in situ surface cleaning of particles by ion bombardment with oxygen- and argon-containing plasmas prior to deposition of DLN, and (iv) the ability to tailor the bulk and surface properties of the coatings by manipulating the composition of the coating and the intensity of ion bombardment during the coating process.

14 Claims, 2 Drawing Sheets

METHOD FOR COATING DIAMOND-LIKE NETWORKS ONTO PARTICLES

TECHNICAL FIELD

This invention relates to a method of and apparatus for depositing diamond-like networks comprising carbon and optionally comprising at least one of hydrogen, nitrogen, oxygen, fluorine, silicon, sulfur, titanium, or copper onto particles.

BACKGROUND ART

Carbon coatings or films are known to be quite hard, chemically inert, corrosion resistant, and repellent to water vapor and oxygen. Such coatings are beneficial for their mechanical and chemical protective properties. Carbon thin films or coatings can be deposited on planar substrates in the form of, for example, graphite, crystalline diamond, and amorphous diamond-like networks (DLN). These films have differing physical and chemical properties.

DLN coatings have been applied to a wide variety of planar substrates, such as organic materials, polymeric films, ceramic substrates (e.g., aluminum oxide, barium titanate, and boron nitride), semiconductor substrates (such as silicon, germanium, gallium arsenide, cadmium telluride, and the like), and metal substrates (e.g., aluminum, stainless steel, nickel, and copper). Specific applications include magnetic rigid disks, sunglasses, ophthalmic lenses and infrared windows.

A number of methods have been developed for depositing carbon coatings on planar substrates, using solid carbon and hydrocarbon sources. Techniques using solid carbon sources include methods such as sputtering, laser evaporation, pulsed discharge rail gun, and cathodic arc deposition.

Several methods also exist to deposit types of organic or inorganic thin films onto particles. These include wet chemical methods, powder transfer onto particles in a mechanically or magnetically agitated particle bed, and fluidized bed chemical vapor deposition. None of these methods is useful for the deposition of densely packed diamond-like networks onto particles.

DISCLOSURE OF THE INVENTION

Diamond-like networks are desirable as coatings because they provide both chemical and mechanical protection. An unmet need in the art is a method to deposit densely packed diamond-like networks onto the surface of particles. An essential requirement for creating a densely packed coating is ion bombardment during the deposition process. None of the techniques available for coating particles facilitates ion bombardment during deposition of the coatings. Additionally, it was not expected that the process for depositing DLN on planar substrates would work for particles.

One object of this invention is to deposit densely packed coatings of amorphous materials comprising carbon and further optionally comprising hydrogen, nitrogen, oxygen, fluorine, silicon, sulfur, titanium, and copper onto particles. It is a further object of this invention to apply densely packed coatings in a uniform manner on each particle surface.

In one aspect, this invention is a method of depositing a diamond-like network onto particles comprising:

providing a capacitively coupled reactor system, comprising two electrodes in an evacuable reaction chamber;

placing a multiplicity of particles on or near one of the electrodes;

evacuating the chamber;

applying radio frequency (RF) power to one electrode, and grounding the other electrode;

introducing a carbon-containing source into the reaction chamber thereby forming a plasma comprising reactive species in proximity to the multiplicity of particles and further forming ion sheaths around the electrodes;

agitating the multiplicity of particles in such a manner as to expose their surfaces to the reactive species in the plasma while keeping the particles substantially within an ion sheath.

In another aspect, this invention is an apparatus for coating a diamond-like network onto particles, comprising:

an evacuable chamber containing two electrodes;

means for introducing a carbon-containing source into the chamber;

an RF power source connected to one electrode; and means for agitating a multiplicity of particles in proximity to one of the electrodes.

In this application, "diamond-like network" (DLN) refers to amorphous films or coatings comprised of carbon and optionally comprising one or more additional components selected from the group consisting of hydrogen, nitrogen, oxygen, fluorine, silicon, sulfur, titanium, and copper. The diamond-like networks comprise approximately 30 to 100 atomic percent carbon, with optional additional components making up the remainder. An individual additional component may comprise up to approximately 50 atomic percent of the coating. Almost all diamond-like networks contain hydrogen, usually in an amount of 5 to 50 atomic percent. However, for some compositions, hydrogen is not a preferred component. The total amount of components other than carbon may comprise up to approximately 70 atomic percent of the entire coating. The diamond-like networks have a gram atom density of between approximately 0.20 and approximately 0.28 gram atoms per cubic centimeter, and are composed of approximately 50 to 90% tetrahedral bonds.

As used in the application, "amorphous" means a randomly-ordered non-crystalline material having no x-ray diffraction peaks.

As used in this application, "parallel plate reactor" means a reactor containing two electrodes wherein the primary mechanism for current flow between the electrodes is capacitive coupling. The electrodes may be asymmetric, meaning that they may be of different size, shape, surface area, etc. and need not necessarily be parallel to each other. One electrode may be grounded. One electrode may be the reaction chamber itself. Further, the linear dimensions, e.g., the length or diameter, of the electrodes are large compared to the depth or thickness of the ion sheaths which form around the electrodes.

The advantages of the present invention include (i) the efficient deposition of DLN onto particles at high deposition rates, (ii) the deposition of densely-packed DLN coatings, (iii) the ability to perform in situ surface cleaning of particles by ion bombardment with oxygen- and argon-containing plasmas prior to deposition of DLN, and (iv) the ability to tailor the bulk and surface properties of the coatings by manipulating the composition of the coating and the intensity of ion bombardment during the coating process.

Other advantages of the invention will be apparent from the following description, figures, examples, and from the appended claims.

DETAILED DESCRIPTION

Figure 1:
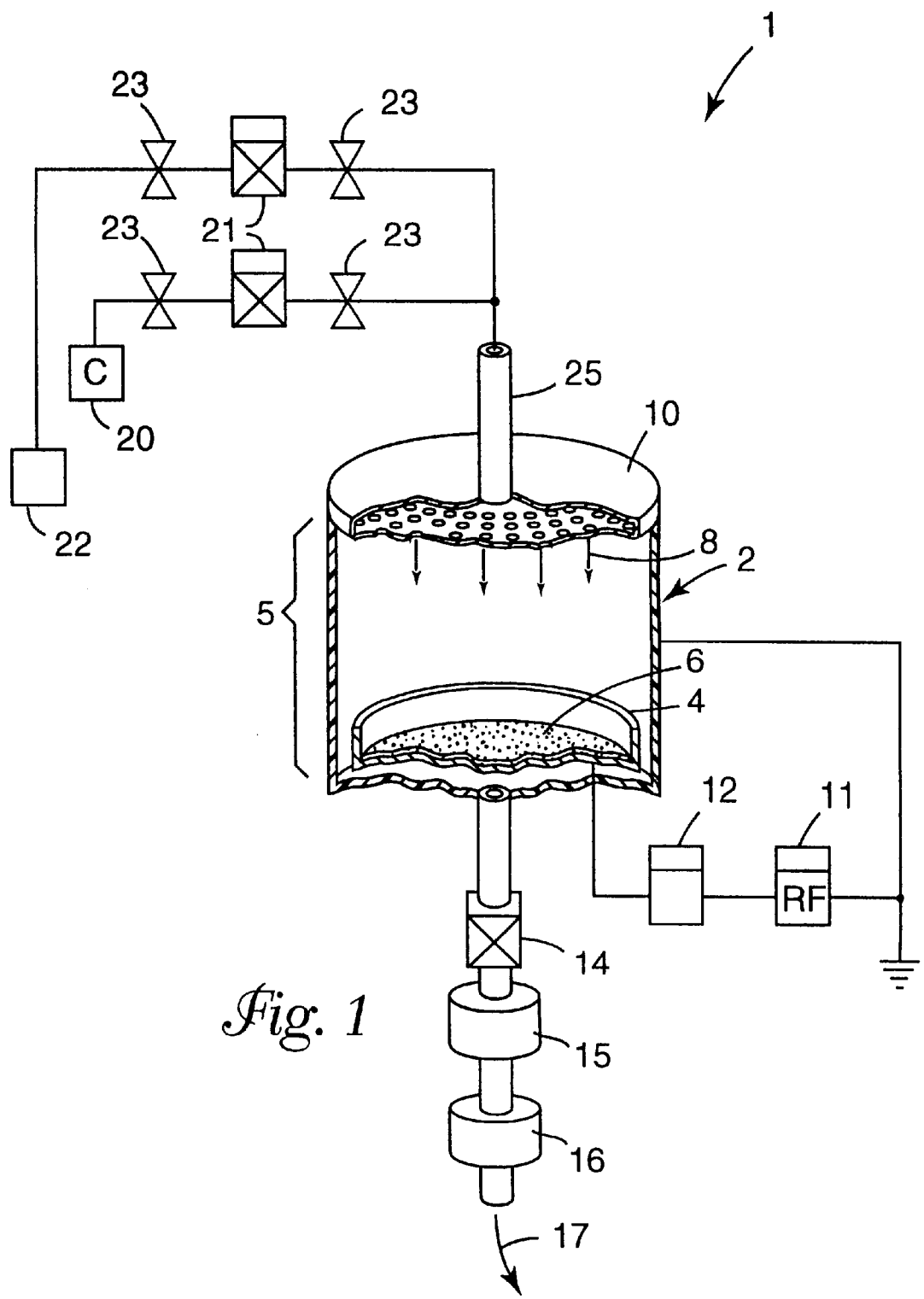
FIG. 1 is an illustrative diagram of an embodiment of the coating method and apparatus of this invention.

This invention provides a method and an apparatus for depositing a diamond-like network (DLN) on at least a portion of the surface of a particle; preferably the DLN covers the entire particle. The DLN coating is most preferably uniform. A uniform coating is one which has a uniform thickness and composition and is free of major defects such as discontinuities. The thickness of the DLN ranges from about 1 to 1000 nanometers (nm) (10 to 10,000 Angstrom (A)).

Particles have previously been coated with diamond thin films. Although one would expect the characteristics and structural properties of diamond and DLN to be similar, this is not the case. They differ significantly due to the arrangement of carbon atoms in the specific material. Carbon coatings substantially contain two types of carbon-carbon bonds: trigonal graphite bonds ($sp^2$) and tetrahedral diamond bonds ($sp^3$). Diamond is composed of virtually all tetrahedral bonds, DLN is composed of approximately 50 to 90% tetrahedral bonds, and graphite is composed of virtually all trigonal bonds. The type and amount of bonds are determined by infrared (IR) and nuclear magnetic resonance (NMR) spectra.

The crystallinity and the nature of the bonding of the carbon network determine the physical and chemical properties of the coating. Diamond is crystalline whereas DLN is a non-crystalline amorphous material, as determined by x-ray diffraction. Diamond is essentially pure carbon, whereas DLN can contain a substantial amount of additional components (up to approximately 50 atomic percent for a single component, and up to approximately 70 atomic percent for the combination of all additional components). The atomic percents are determined by combustion analysis.

Diamond has the highest packing, or gram atom, density (GAD) of any material at ambient pressure. Its GAD is 0.28 gram atoms/cc. Diamond-like carbon-containing networks have a GAD ranging from about 0.20 to 0.28 gram atoms/cc. In contrast, graphite has a GAD of 0.18 gram atoms/cc. The high packing density of DLN affords it excellent resistance to diffusion of liquid or gaseous materials. Gram atom density is calculated from measurements of the weight and thickness of a material. "Gram atom" refers to the atomic weight of a material expressed in grams.

DLN coatings are diamond-like because, in addition to the foregoing physical properties that are similar to diamond, they have many of the desirable performance properties of diamond such as extreme hardness (1000 to 2000 kg/mm2), high electrical resistivity ($10^9$ to $10_{13}$ ohm-cm), a low coefficient of friction (0.1), and optical transparency over a wide range of wavelengths (extinction coefficient of less than 0.1 in the 400 to 800 nanometer range).

However, diamond coatings have some properties which, in many applications, make them less beneficial as a coating than DLN. Diamond coatings have a grain structures, as determined by electron microscopy. The grain boundaries are a path for chemical attack and degradation of the coated particles. The amorphous DLN coatings do not have a grain structure, as determined by electron microscopy.

Diamond and DLN also have different light absorption characteristics. This can be important when the coated particle is used for its light emitting properties. For example, diamond has no intrinsic fundamental absorption in the blue light range because its optical band gap is 5.56 eV and it is transmissive well into the ultraviolet region. DLN comprising carbon and hydrogen, on the other hand, contains small amounts of unsaturated bonds due to carbon-carbon double bonding, which causes an optical absorption band in the blue region of the electromagnetic spectrum. However, notwithstanding the excellent light transmission characteristics of the diamond lattice, the polycrystalline structure of diamond coatings causes light scattering from the grain boundaries which can reduce luminosity of the coated particle. Surprisingly, the present inventors found that the amorphous DLN coatings allow for excellent light transmission even when coated on particles light emitting with a primary light emission in the blue-green region of the electromagnetic spectrum, despite their absorption of blue light. Additionally, the present inventors found that the visible light transmission of a carbon and hydrogen network could be further improved by incorporating silicon and oxygen atoms into the amorphous diamond-like carbon network during the deposition process. This is not possible for diamond thin films because additional components will disrupt its crystalline lattice structure.

In creating a diamond-like network, various additional components can be incorporated into the basic carbon or carbon and hydrogen composition. These additional components can be used to alter and enhance the properties that the DLN coating imparts to the particles. For example, it may be desirable to further enhance the barrier and surface properties. Decreasing the surface energy of the coating is thought to enhance the barrier properties by increasing the hydrophobicity of the coating. Altering the surface properties may improve the ability of the particles to be dispersed in a matrix normally incompatible with the particles.

The additional components may comprise one or more of hydrogen, nitrogen, oxygen, fluorine, silicon, sulfur, titanium, or copper. Other additional components may also work well. The addition of hydrogen promotes the formation of tetrahedral bonds. The addition of fluorine is particularly useful in enhancing barrier and surface properties of the DLN coating, including the ability to be dispersed in an incompatible matrix. The addition of silicon and oxygen to the DLN coating tend to improve the optical transparency and thermal stability of the coating. The addition of nitrogen may be used to enhance resistance to oxidation and to increase electrical conductivity. The addition of sulfur can enhance adhesion. The addition of titanium tends to enhance adhesion as well as diffusion and barrier properties. The addition of copper can enhance adhesion and electrical conductivity.

The additional components may be incorporated into the diamond-like matrix or attached to the surface atomic layer. If the additional components are incorporated into the diamond-like matrix they may cause perturbations in the density and/or structure, but the resulting material is essentially a densely packed network with diamond-like characteristics (chemical inertness, hardness, barrier properties, etc.) as long as the coating has at least approximately 30 atomic percent carbon. With most additional components, hydrogen is a beneficial component because it promotes the formation of tetrahedral bonds. However, in some cases, as with fluorine, hydrogen is not a beneficial component and is preferably not added. Typically, the amount of any one additional component can be up to about 30 atomic percent. If the total concentration of all components other than carbon is greater than approximately 70 atomic percent of the total coating, the density of the coating may be affected and the beneficial properties of the diamond-like network may be lost. The particular effect depends on the additional components and their concentrations. If the additional components are attached to the surface atomic layers they will alter only the surface structure and properties. The bulk properties of the diamond-like network will be preserved.

This invention is useful for any particle that may benefit from a densely-packed DLN coating on at least a portion of its surface. Particles which can be coated by the method of this invention include particles comprising organic and inorganic materials. The particles may comprise crystalline, semi-crystalline, or amorphous materials. The particles may be a single composition or element or may comprise agglomerates of smaller particles of differing compositions. The particles may be coated or uncoated and may be conductive or non-conductive. The particles are not restricted to any particular shape and may be, for example, fibrous, flaky, spherical, cubic, pyramidic, irregularly shaped and so on. Typically the particle size ranges in size from about 10 micrometers to about 100 micrometers because of the vacuum conditions of the process. At sizes of less than about 10 micrometers, the particles can be difficult to handle in a vacuum system, and at sizes greater than 100 micrometers, the particles are difficult to agitate in a vacuum system.

Suitable particles for practice of this invention include both conductive and nonconductive particles and include particles comprising organic materials (such as polyethylene beads and powdered forms of organic dyes and pigments), inorganic materials (such as silicon), and metal compounds (such as metal sulfides, selenides, oxides, nitrides, carbides, and borides), semiconductor materials (such as silicon, germanium, gallium arsenide, zinc oxide, zinc sulfide, and the like), and metals (including copper, tungsten, aluminum and the like), and particles having metallic coatings of nickel, tungsten, and the like.

Methods exist to deposit types of organic and inorganic coatings and diamond films on particles, but these methods are unsuitable for the deposition of DLN on particles. For example, U.S. Pat. No. 5,439,705 (Budd) describes a method of chemical vapor deposition to deposit oxide coatings on phosphor particles. Japanese Kokai Patent Application No. HEI 4 [1992]-304290 describes the use of a microwave plasma process to deposit a diamond thin-film onto the surface of phosphor particles in a continuous process.

The conditions necessary for chemical vapor deposition (CVD) of oxide coatings do not include a plasma, which is required for the deposition of DLN. The chemical vapor deposition techniques also do not form ionic species, which are necessary for the deposition of densely-packed DLN. Further, CVD is an equilibrium process which generates equilibrium phases. DLN is a non-equilibrium process.

The conditions required for diamond thin-film deposition will not deposit DLN and may be detrimental to the particles. The process for diamond film deposition uses pressures of 1.3 to 133 kPa (10–100 Torr) and temperatures of 90–900° C. (preferably 700–800° C.). The high temperatures required for depositing diamond can degrade the particles. Further, diamond deposition requires a flux of atomic hydrogen to form the crystalline structure. The immense atomic hydrogen flux during deposition may passivate the particle surface. Also, hydrogen recombination at the film growth surface generates large amounts of heat which can cause thermal degradation of the particles.

Additionally, the process used for diamond thin-film deposition is substantially different from, and not suitable for, the deposition of DLN coatings. In the process for making diamond film, atomic hydrogen is present in the gas phase. This atomic hydrogen in the diamond-making plasma will etch DLN instead of depositing it as a thin film. In contrast, during the DLN formation process, there is virtually no atomic hydrogen present in the gas phase, although the DLN film itself contains hydrogen. The presence of the bonded hydrogen within the DLN film promotes the formation of tetrahedral bonds, leading to an increase in the atomic packing density of the DLN. Further, the diamond reactor configuration will not permit the formation of an ion sheath which is necessary for the deposition of densely-packed DLN coatings. Formation of an ion sheath and ion bombardment, which occur in the present method of DLN deposition, will not produce or enhance diamond coatings.

In the method of this invention, diamond-like network (DLN) coatings are deposited onto particles from carbon-containing gases and optionally gases containing additional components by plasma deposition. Deposition occurs at reduced pressures (relative to atmospheric pressure) and in a controlled environment. A carbon rich plasma is created in a reaction chamber by applying an electric field to a carbon-containing gas. Particles to be coated are held in a vessel or container in the reactor and are agitated while in proximity to the plasma. Species within the plasma react on the particle surface to form covalent bonds, resulting in DLN on the surface of the particles. A parallel plate reactor is used. This type of reactor causes energy to be capacitively coupled into the plasma. Using a radio frequency power source further causes an ion sheath to form around the electrodes. The ion sheath has a lower electron density than the main plasma region. This causes it to glow less than the main plasma region and appear to be a darker color. This produces ion bombardment which results in faster deposition of a more densely packed DLN coating on the particles when the particles are kept within the ion sheath during the deposition process.

A multiplicity of particles is coated during the process of this invention. "Multiplicity" refers to more than one particle; typically at least many thousands of particles are coated at the same time during this process. The quantity to be coated depends upon the size and configuration of the reaction chamber as well as the desired agitation means.

The particles are held in a vessel or container within an evacuable chamber which is capable of maintaining conditions that produce DLN deposition. That is, the chamber provides an environment which allows for the control of, among other things, pressure, the flow of various inert and reactive gases, voltage supplied to the powered electrode, strength of the electric field across the ion sheath, formation of a plasma containing reactive species, intensity of ion bombardment, particle agitation means, and rate of deposition of a diamond-like network from the reactive species onto the surface of the particles.

To expose the entire particle surface to the reactive species from the plasma, the particles are agitated while in the reaction chamber. The particles are preferably in constant motion during the deposition of the DLN. Useful methods for agitating the particles include shaking, vibrating, or rotating the container holding the particles, stirring the particles, or suspending the particles in a fluidized bed. Variable magnetic fields can also be used to agitate the particles.

Suitable containers for agitating the particles include vibrating trays or reaction chambers fitted with a suitable porous material, such as a quartz or glass frit, through which gases may flow to cause agitation of the particles. It is possible to use more than one agitation method during the coating deposition; the important features are that essentially the entire surface of each particle is exposed to the coating flux from the plasma and that the particles and reactive species, comprising a mixture of free radicals and ions, are well intermixed. Preferred methods of agitating the particles in the practice of this invention include vibrating trays, fluidized beds, and spouted beds.

In some case, the container holding the particles is the evacuable chamber, as for a fluidized or spouted bed arrangement. Hence the container may be referred to as a reactor or reaction chamber. Prior to the deposition process, the chamber is evacuated to remove air and any impurities. Inert gases (such as argon) may be admitted into the chamber to alter pressure and/or assist in fluidization of the particles.

In a fluidized bed, a gas (e.g., an inert gas such as argon and/or a reactant gas) flows through the multiplicity of particles, agitating the particles and exposing all sides of the particles to the plasma. Typically most of the particles rise up into the main plasma region, and out of the ion sheath that surrounds the electrode on which the particles are placed, due to the gas flow through the particle bed. A spouted bed is a type of fluidized bed. It is created by applying lower gas velocities than for a standard fluidized bed. This allows the particles to remain substantially within the ion sheath while still undergoing good mixing. In a spouted bed, as gas pockets form and rise to the surface, agitation and fluidization occur periodically in spurts, similar to a liquid that is just beginning to boil. This is in contrast to the continuous agitation and fluidization that occurs in a fluidized bed at steady-state, similar to a fluid at a full boil.

Once the particles are placed in the chamber and it is evacuated, a substance containing carbon and (usually) hydrogen, preferably a hydrocarbon-containing gas, and optionally a substance from which an additional component can be deposited, is admitted into the chamber and, upon application of an electric field, forms a plasma from which the diamond-like network is deposited. At the pressures and temperatures of DLN deposition (typically 0.13 to 133 Pa (0.001 to 1.0 Torr) (all pressures stated herein are gauge pressure)and less than 50° C.), the carbon-containing substances and substances from which an optional additional component may be obtained will be in their vapor form.

Plasma refers to a partially ionized gaseous or fluid state of matter containing reactive species which include electrons, ions, neutral molecules, free radicals, and other excited state atoms and molecules. Visible light and other radiation are emitted from the plasma as the species comprising the plasma relax from various excited states to lower, or ground, states. The plasma appears as a colored cloud in the reaction chamber.

For the deposition of carbon and hydrogen in the diamond-like network, hydrocarbons are particularly preferred; such include acetylene, methane, butadiene, benzene, methylcyclopentadiene, pentadiene, styrene, naphthalene, and azulene. Mixtures of these hydrocarbons may also be used. Gases containing optional additional components can also be introduced to the reaction chamber. Gases with low ionization potentials, i.e., 10 eV or less, preferably are used for efficient deposition of the DLN.

The additional optional DLN components, comprising one or more of hydrogen, nitrogen, oxygen, fluorine, silicon, sulfur, titanium, or copper, are introduced in vapor form into the reaction chamber during the deposition process. Typically, even when the sources for the additional components to the DLN are solids and fluids the reduced pressure in the coating chamber will cause the source to volatilize. Alternatively, the additional components may be entrained in an inert gas stream. The additional components may be added to the chamber while a carbon- or hydrocarbon-containing gas is sustaining the plasma and/or may be added to the chamber after the flow of carbon or hydrocarbon gas has been stopped.

Sources of hydrogen include hydrocarbon gases and molecular hydrogen ($H_2$). Sources of fluorine include compounds such as carbon tetrafluoride ($CF_4$), sulfur hexafluoride ($SF_6$), perfluorobutane ($C_4F_{10}$), $C_2F_6$, $C_3F_8$, and $C_4F_{10}$ Sources of silicon include silanes such as $SiH_4$ and $Si_2H_6$ and hexamethyldisiloxane. Sources of oxygen include oxygen gas ($O_2$), hydrogen peroxide ($H_2O_2$), water ($H_2O$), and ozone ($O_3$). Sources of nitrogen include nitrogen gas ($N_2$), ammonia ($NH_3$), and hydrazine ($N_2H_6$). Sources of sulfur include sulfur hexafluoride ($SF_6$), sulfur dioxide ($SO_2$), and hydrogen sulfide ($H_2S$). Sources of copper include copper acetylacetonate. Sources of titanium include titanium halides such as titanium tetrachloride.

Those of skill in the art recognize various reactor configurations for accomplishing plasma deposition of DLN on planar substrates. However, to achieve deposition of a densely-packed DLN coating, an RF powered parallel plate capacitively coupled plasma reactor is required. This type of system produces an ion sheath around the electrodes. RF power must be used to create the ion sheath. The ion sheath is necessary to obtain ion bombardment, which, in turn, is necessary to produce a densely-packed DLN-coating. While DLN deposition can be achieved without ion bombardment, ion bombardment is necessary to produce a densely-packed DLN coating. An explanation of the formation of ion sheaths can be found in Brian Chapman, *Glow Discharge Processes*, 153 (John Wiley & Sons, New York 1980).

In a parallel plate reactor, two electrodes are located in the reaction chamber. One electrode is powered and one is grounded. The electrodes may be the same size or different sizes. If the electrodes are different sizes, the smaller electrode will have a larger ion sheath (regardless of whether it is the grounded or powered electrode). This type of configuration is referred to as "asymmetric" parallel plate reactor. An asymmetric configuration produces a higher voltage potential across the ion sheath surrounding the smaller electrode. Establishing a large ion sheath on one of the electrodes is preferred for this invention because the particles are preferably located within an ion sheath to benefit from the ion bombardment effects that occur within the sheath. Preferred electrode surface area ratios are from 2:1 to 4:1, and more preferably from 3:1 to 4:1. The ion sheath on the smaller electrode will increase as the ratio increases, but beyond a ratio of 4:1 little additional benefit is achieved. The reaction chamber itself can act as an electrode. A preferred configuration for this invention comprises a powered electrode within a grounded reaction chamber which has two to three times the surface area of the powered electrode. This arrangement is depicted, for example, in FIGS. 1 and 2. The reaction chamber is typically cylindrical but may be of any shape.

In an RF-generated plasma, energy is coupled into the plasma through electrons. The plasma acts as the charge carrier between the electrodes. The plasma fills the entire reaction chamber and is visible as a colored cloud. The ion sheath appears as a darker area around one or both electrodes. In a parallel plate reactor using RF energy, the applied frequency should be in the range of 0.001 to 100 MHz, preferably 13.56 MHz or any whole number multiple thereof. This RF power creates a plasma from the gas (or gases) within the chamber. The RF power source can be an RF generator such as a 13.56 MHz oscillator connected to the powered electrode via a network that acts to match the impedance of the power supply with that of the transmission line and plasma load (which is usually about 50 ohms so as to effectively couple the RF power). Hence this is referred to as a matching network.

The ion sheath around the electrodes causes negative self-biasing of the electrodes relative to the plasma. In an asymmetric configuration, the negative self-bias voltage is negligible on the larger electrode and the negative bias on the smaller electrode is typically in the range of 100 to 2000 volts. While the acceptable frequency range from the RF power source may be high enough to form a large negative direct current (DC) self bias on the smaller electrode, it should not be high enough to create standing waves in the resulting plasma, which is inefficient for the deposition of a DLN coating.

Based on the mechanistic differences between depositing DLN on a planar substrate and on particles, the capacitively coupled parallel plate reactor method was not expected to work for particles, as is explained further herein. Surprisingly, the present inventors found that this method can produce excellent deposition results for particles.

For planar substrates, deposition of dense diamond-like carbon thin films is achieved in a parallel plate reactor by placing the substrates in direct contact with a powered electrode, which is made smaller than the grounded electrode. This allows the substrate to act as an electrode due to capacitive coupling between the powered electrode and the substrate. This is described in M. M. David, et al., *Plasma Deposition and Etching of Diamond-Like Carbon Films*, AIChE Journal, vol. 37, No. 3, p. 367 (1991), incorporated herein by reference. It has been observed that when the substrate was moved away from the powered electrode, the resultant coating was not dense and took a long time to be deposited. It is believed that as the substrate moves away from the powered electrode it moves out of the range of the capacitive coupling effect and loses its ability to act as an electrode. The very nature of particles in a particle bed, e.g., their non-planar geometry, their loosely-packed configuration, and the voids that form and disappear in a fluidized bed, would create the expectation that capacitive coupling between the powered electrode and the multiplicity of particles could not occur with a particle bed. One would expect the electrical continuity between the powered electrode and the particles to be lost.

Surprisingly, the benefits of the parallel plate capacitive coupling system were realized when used with a fluidized particle bed when the particles were placed on a smaller powered electrode. High rates of deposition were achieved even though individual particles were not in constant contact with the powered electrode. It is believed that the charge from the powered electrode cascades through the particles, thus imparting the charge from that electrode to and throughout the individual particles in the multiplicity of particles. Thus, the multiplicity of particles, even those not in direct contact with the electrode, act as an electrode having a similar charge to that of the electrode adjacent to the particles.

In addition, the inventors found that the process worked for both insulating and conductive particles. The process was not expected to work for conductive particles based on the problems that occurred with conductive planar substrates. When conductive planar substrates are moved away from the powered electrode but still maintained within the ion sheath, arcs generally form between the substrate and the electrode. No arcing was observed in coating conductive particles.

The combined effects of the charge imparted to the particles from the powered electrode and the ion bombardment in the ion sheath help to produce the densely-packed DLN coatings. The electric field in the ion sheath causes positively-charged ions and free radicals from the main plasma region to accelerate and gain energy as they traverse the ion sheath. These ions are attracted to and bombard the negatively charged particles located in the ion sheath. The bombardment causes densification of the carbon and optional additional components being deposited on the particle and results in formation of a densely-packed diamond-like coating on the particle. It also increases the rate of deposition.

Because deposition rates and densification of the DLN coating are maximized by the ion bombardment that occurs within the ion sheath, manipulating the conditions of the reaction chamber to keep the particles substantially within the ion sheath and to increase ion bombardment will optimize the deposition process. The depth of an ion sheath ranges from approximately 1 mm (or less) to 50 mm and depends on the type and concentration of gas used, pressure applied, and relative size of the electrodes. For example, reduced pressures will increase the size of the ion sheath as will having different sized electrodes. And using a spouted bed or vibrating tray rather than a steady-state fluidized bed will minimize the volume of the agitated particles and keep them substantially within the ion sheath. Also, increasing the voltage across the ion sheath will increase ion bombardment.

Deposition of the DLN typically occurs at rates ranging from about 1 to 100 nm/second (about 10 to 1000 Angstrom per second (A/sec)), depending on conditions including pressure, power, concentration of gas, types of gases, relative size of electrodes, etc. In general, deposition rates increase with increasing power, pressure, and concentration of gas, but the rates will approach an upper limit. By keeping the particles within the ion sheath, continuous coatings as determined by visual inspection of the particles were obtained within 30 minutes; whereas, several hours may be required to obtain similar coating thicknesses on particles not maintained within an ion sheath during the coating process.

The Figures illustrate further detail of preferred methods of preparing the DLN-coated particles of this invention.

FIG. 1 illustrates a method and apparatus for DLN coatings on particles. Coating system 1 comprises a planar electrode powered by RF and a grounded reaction chamber, which has a surface area greater than that of the powered electrode. The particles are placed on an aluminum vibrating tray to agitate the particles during DLN plasma deposition. The tray acts as the powered electrode. Capacitive coupling of the RF-generated plasma results in formation of an ion sheath around the powered electrode (the tray). A large electric field is established across the ion sheath. The presence of the electric field produces a significant amount of ion bombardment resulting in significant densification of the DLN coating.

Multiplicity of particles 6 is placed on the aluminum tray which serves as electrode 4. Other suitable conductive materials may be used for this electrode, and include, for example, stainless steel, copper, graphite, nickel, brass, and the like. A preferred electrode material is aluminum due to the ease of fabrication, low sputter yield, and low cost. Electrode 4 is vibrated by means of a pneumatic vibrator, ultrasonic vibrator, or electromechanical vibrator such as those available from McMaster-Carr Supply Co., Chicago, Ill., e.g., Part No. 5802K11 (not shown). Powered electrode 4 is located in evacuable aluminum chamber 2 which acts as a grounded electrode.

Chamber 2 is pumped by means of two vacuum pumps connected in series: roots blower 15, which is a type of pump available from Leybold Hareus, Export, Pa., Model No. WSU501 backed by mechanical vacuum pump 16 such as Model No. D-60 from Leybold Hareus, Export, Pa., which produce exhaust stream 17. Aluminum is also a preferred chamber material because it has a low sputter yield, which means that very little contamination of the DLN coating occurs due to the chamber surfaces. However, other suitable materials, such as graphite or stainless steel, may be used. Gate valve 14 serves to isolate chamber 2 from the pumps while venting chamber 2 to the atmosphere or to appropriate scrubbers (not shown).

The desired process gases are supplied from their respective storage tanks (20 for carbon-containing gas and 22 for additive gases) through stainless steel inlet tube 25 to vacuum chamber 2. Pneumatic isolation valves 23 control the flow of gases. The flow rates of the gases are kept constant by means of mass flow controllers 21. Stream of gas 8 is distributed uniformly throughout chamber 2 by means of perforated aluminum plate 10 (also known as the showerhead) which has holes that are approximately 750 micrometers in diameter and has approximately 2 to 4 holes per square centimeter (5 to 10 holes per square inch). The showerhead may also be comprised of other materials, typically machinable materials such as copper and stainless steel.

Upon loading the particles onto the aluminum tray serving as electrode 4, chamber 2 is closed and evacuated to a base pressure below 0.65 Pa (5 mTorr). Evacuation of the chamber serves to remove oxygen and any other species which might result in contamination of the DLN coating. The desired gas (e.g., a hydrocarbon-containing gas) is introduced into chamber 2 at a desired flow rate, which depends on the size of the reactor and the amount of particles in the reactor. Such flow rates must be sufficient to establish a suitable pressure at which to carry out plasma deposition, typically 0.13 Pa to 130 Pa (0.001 Torr to 1.0 Torr). For a reactor that has an inner diameter of approximately 55 cm and a height of approximately 20 cm, the flow rates are typically between 50 and 500 standard cubic centimeters per minute (sccm).

When the gas flow is stabilized, plasma is ignited in the chamber by activating power supply 11. Plasma is generated and sustained by means of power supply 11 (an RF generator operating at a frequency in the range of 0.001 to 100 MHz). To obtain efficient power coupling (i.e., wherein the reflected power is a small fraction of the incident power), the impedence of the plasma load is matched to power supply 11 by means of matching network 12 comprising two variable capacitors and an inductor, available from RF Power Products, Kresson, N.J., as Model # AMN 3000. A description of such networks can be found in Brian Chapman, *Glow Discharge Processes,* 153 (John Wiley & Sons, New York 1980). Plasma region 5 forms throughout chamber 2. The plasma region has two areas: the main plasma region and the ion sheath. The ion sheath (not depicted) surrounds powered electrode 4 and is a region of high electric field. A pneumatic vibrator is attached to the powered electrode tray and activated for the duration of the plasma treatment in order to provide for the agitation of particles.

The plasma is maintained for a time sufficient to deposit a diamond-like network of the desired thickness onto the particles. Typically such deposition times range from about 10 minutes to about 10 hours. If other additional components are desired, another gas inlet system, similar to the combination of storage tank 20, mass flow controllers 21, and pneumatic isolation valve 23 can be connected to inlet tube 25.

Figure 2:
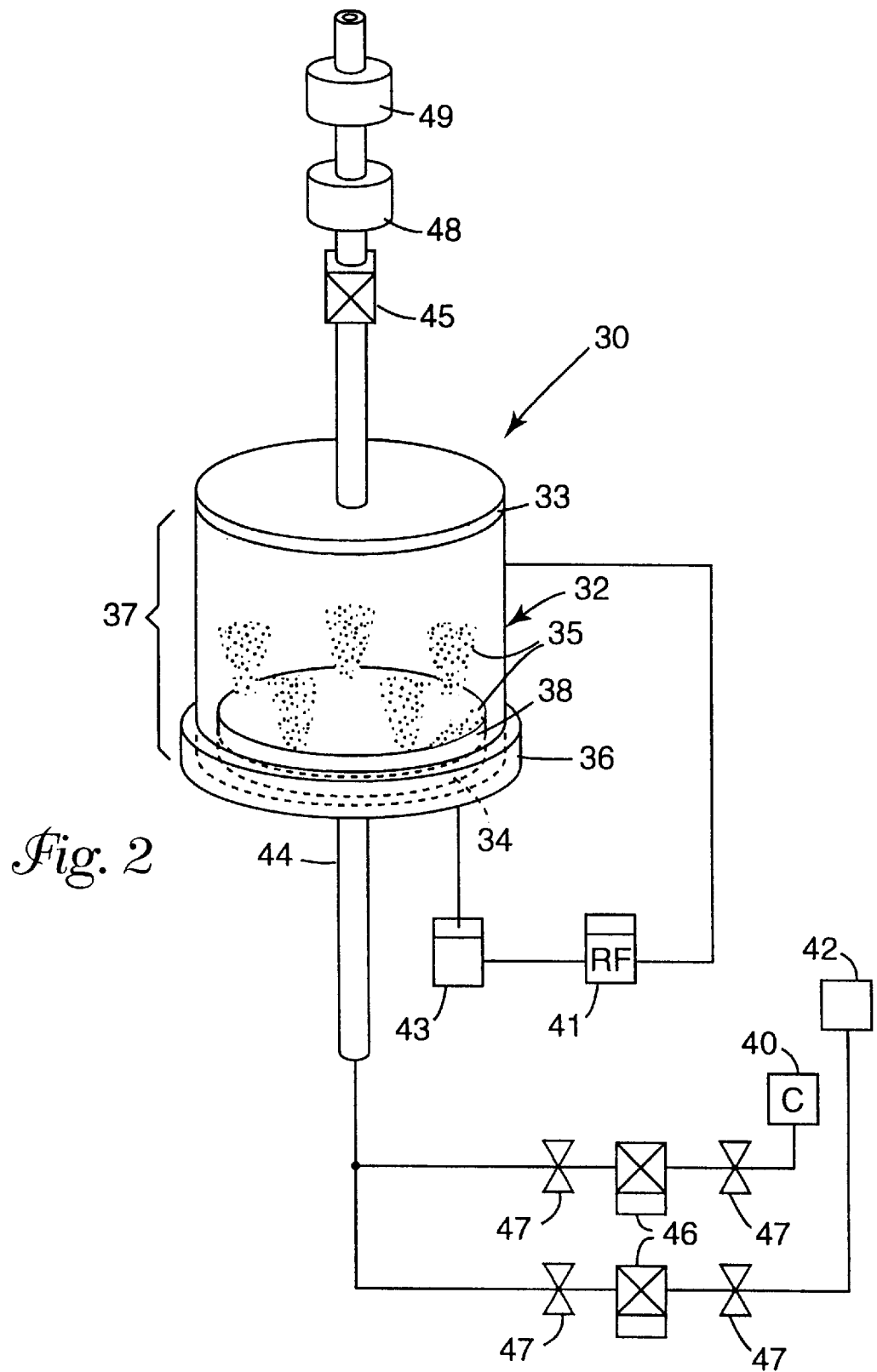
FIG. 2 is an illustrative diagram of a second embodiment of the coating method and apparatus of this invention.

FIG. 2 illustrates another suitable method and apparatus for making the DLN-coated particles of this invention. Coating system 30 comprises a planar electrode powered by RF and a grounded reaction chamber, which acts as a second electrode. Capacitive coupling of the plasma results in formation of an ion sheath (around the powered electrode) having a large electric field. The particles are agitated by means of a spouted bed maintained by gas flow through the particle bed located on the powered electrode. That is, most of the particles are within the ion sheath, near the powered electrode, during the coating process and some of the particles are suspended within the main plasma region. The ratio of the surface area of grounded electrode (i.e., chamber) area to powered electrode area is about 4:1. Particles 35 are placed on glass frit 38 and agitated by means of the spouted bed which forms as a result of gas entering beneath glass frit 38. A spouted bed is a fluidization method that uses low gas flow rates. As gas pockets form and rise to the surface, particles are spurted upward. The main body of particles occupies a volume that is greater than the particle bed at rest, but smaller than the volume of a regular fluidized bed at steady-state. Evacuable aluminum chamber 32 is fitted at the top with aluminum plate 33 connected to two vacuum pumps connected in series: roots blower 48 backed by mechanical pump 49. Aluminum is a preferred fabrication material but any suitable conductive material, and preferably, non-magnetizable material may be used. Pneumatic isolation valve 45 serves to isolate chamber 32 from the pumps while venting chamber 32 to the atmosphere or to appropriate scrubbers (not shown). The desired process gases are supplied from their respective storage tanks (40 for hydrocarbon gas and 42 for inert or additive gas) through stainless steel inlet tube 44 beneath frit 38 and into chamber 32. Pneumatic isolation valves 47 control the flow of gases. The flow rates of the gases are kept constant by means of mass flow controllers 46. The bottom of chamber 32 is fitted with insulation plate 36 which holds plate electrode 34. Insulation plate 36 comprises an insulating material such as plastic; for example, polyesterimide (ULTEM™). Plasma (in plasma region 37) is generated and sustained by means of power supply 41 (an RF generator operating at a frequency of 13.56 MHz) which powers electrode 34 and is grounded on chamber 32. Densification of the DLN on the particles occurs within an ion sheath (not depicted) which forms around powered electrode 34. The impedance of the plasma load is matched to power supply 41 by means of matching network 43. The particles are agitated for the duration of the deposition process. The plasma is maintained for a time sufficient to deposit a diamond-like network of the desired thickness onto the particles. Typically such deposition times range from about 10 minutes to about 10 hours.

Densely packed diamond-like networks have enormous technological potential due to excellent chemical and mechanical properties, which include extreme hardness, chemical inertness, excellent barrier properties, corrosion resistance, low friction, biocompatibility (e.g., resistance to thrombogenesis), low surface energy, optical transparency, and electrical resistivity. These properties are imparted to particles when these diamond-like networks are deposited on their surfaces. The DLN-coated particles are then useful as abrasives, encapsulated pigments and dyes, chromatographic supports, phosphors, thermally conductive elements, inert fillers and the like.

EXAMPLES

This invention may be illustrated by way of the following examples.

Testing Methods

The following test methods were used to evaluate and characterize the DLN coatings produced in the examples.

Hydrophobicity

The hydrophobic nature of the DLN-coated particles was observed by suspending the particles in water. The DLN-coated particles did not become wet but floated or agglomerated into clumps of particles. In contrast, uncoated and oxide(only)-coated particles became wet and dispersed in the water.

The wetting tension of a surface is related to the hydrophobicity of that surface. This can be measured by using the surface tension of water; or, more specifically, by measuring the angle formed by a drop of water in contact with a surface. Because this is difficult to measure on a single coated particle, DLN coated onto a planar substrate was used to obtain a measurement of contact angle. DLN, comprising mainly carbon and hydrogen, was deposited onto a silicon wafer (coated by the inventors under similar process conditions as described for the particles) and the contact angle of water on the coated wafer was measured to be between about 70° and 80°. This indicates that the wetting tension and thus the hydrophobicity of the DLN is high.

Resistance to Chemical Attack

Chemical resistance was determined for coated inorganic phosphor particles by dispersing a small quantity (several grams) of the DLC-coated particles in an aqueous 1.0 N silver nitrate solution. The relative resistance was determined according to the time taken to darken the inorganic phosphor particle from its normal yellowish-white color to a grayish-black color. The DLC-coated particles took approximately 5–10 hours to darken while uncoated particles took only 5 minutes to darken.

Coating Properties

The particles were examined under a scanning electron microscope which revealed that the DLC coatings were amorphous and had no grain structure. The hardness of the coatings were estimated based on mhos hardness tests performed on silicon wafers subjected to a similar coating process. The silicon wafers had a hardness of 7–8 based on a scale of 10.

Example 1

This example illustrates the preparation of DLN on oxide-coated phosphor particles wherein the particles are placed on a vibrating tray in a capacitively coupled asymmetric parallel plate plasma reactor.

A commercial parallel-plate capacitively coupled plasma reactor (commercially available as Model 2480 from PlasmaTherm of St. Petersburg, Fla.) was modified and used for the deposition of DLN. This reactor comprised a grounded chamber electrode containing a powered electrode, materially as depicted in FIG. 1 except the powered electrode comprised both aluminum tray 4 holding the particles and an aluminum plate that was underneath the tray and was attached to a power source. Because of the conductivity of the aluminum, the tray acted as part of the electrode. About 50 grams of oxide-coated phosphor particles (obtained from Durel Corporation, Chandler, Ariz., as Type 729, having a 3000A thick coating of $SiO_2:TiO_2$ and a particle size ranging from 25 to 30 micrometers) were placed in a 10 cm×10 cm vibrating aluminum tray located on the powered electrode of the plasma reactor. The reactor was evacuated to a pressure of less than 0.65 Pa (5 mTorr) and was at a temperature of 20° C. Butadiene gas was introduced into the chamber at a flow rate of 100 sccm (standard cubic centimeters per minute) and pressure of 3.51 Pa (27 mTorr). RF power of 1.3 kW and DC self-bias voltage of 600 Volts was applied to the reactor which caused plasma to form. The plasma filled the reactor and an ion sheath formed around the aluminum tray. Ions in the plasma accelerated toward and bombarded the particles. The temperature increased to between about 60° C. to 70° C. during the deposition. The power was applied for 17 minutes. The thickness of the DLN coating was calculated to be between about 10 and 20 nm (100 and 200 A) based on the deposition rate data for a planar substrate wherein the deposition was conducted by the inventors using similar methods. The deposition on the planar substrate was determined by taking step-height measurements with a profilometer, which measures the profile height of a planar material.

The DLN-coated particles produced by this method were substantially more hydrophobic than oxide-coated particles and displayed high resistance to chemical attack.

Example 2

This example illustrates the preparation of a densely packed network containing carbon and fluorine. The reactor system used was a capacitively-coupled asymmetric parallel plate plasma reactor, materially as depicted in FIG. 2. Particles were placed on a quartz frit placed directly above a powered planar electrode. The reactor acted as the grounded electrode. A spouted bed arrangement was used to agitate the particles.

The reactor comprised a 15.2 cm (6 in.) inner diameter by 15.2 cm (6 in.) high aluminum tube closed on the top by an aluminum plate having pumping ports. On the bottom of this aluminum tube was an assembly of electrode, glass frit, and plastic insulation plate. The electrode was connected to an RF power supply through a matching network.

Phosphor particles (400 grams, obtained from Durel Corporation as Type 729, having a 3000A thick coating of $SiO_2:TiO_2$ and a particle size ranging from 25 to 30 micrometers) were placed on the frit. The system was pumped down to a base pressure of less than 0.0013 kPa (10 mTorr). Perfluorobutane ($C_4F_{10}$) was introduced through an inlet beneath the glass frit by means of a needle valve to achieve a pressure of 0.01664 kPa (128 mTorr) downstream of the chamber which is pumped by a mechanical pump (Leybold Model No. D60). The plasma was ignited and sustained at a power of 200 Watts. No hydrocarbon gas was used in this example. Deposition was carried out for 30 minutes, yielding DLN-coated phosphor particles displaying extreme hydrophobicity and repellency to water.

Example 3

This example illustrates the preparation of a densely-packed diamond-like network containing carbon, hydrogen and silicon (a-C:Si:H) on abrasive particles wherein the particles are first cleaned with an argon plasma. The reactor system used was a parallel plate plasma reactor, materially as depicted in FIG. 2. Particles were placed on a quartz frit placed directly above a powered planar electrode in a parallel plate plasma reactor. The reactor acted as the grounded electrode. A spouted bed arrangement was used to agitate the particles.

The reactor comprised a 15.2 cm (6 in.) inner diameter by 15.2 cm (6 in.) high aluminum tube closed on the top by an aluminum plate having pumping ports. On the bottom of this aluminum tube was an assembly of electrode, glass frit, and plastic insulation plate. The electrode was connected to an RF power supply through a matching network.

Four hundred grams of silicon carbide abrasive grit (Size 80 US Tyler Mesh) was placed on the frit. The system was pumped to a base pressure of 0.0013 kPa (10 mTorr). Prior to deposition of the DLN coating, the abrasive particles were pre-cleaned by generating an argon plasma to prepare the surface of the particles to ensure good adhesion of the DLN coating. With the argon gas flow maintained at 475 sccm, the chamber pressure was approximately 6.75 Pa (500 mTorr). The temperature was initially 20° C. Power was applied and the plasma was initiated. Power was increased to the sustained level of 100 Watts. The argon pre-cleaning was continued for 10 minutes.

Immediately following the argon cleaning step, tetramethylsilane vapor was introduced at a flow rate of 50 sccm and the plasma was maintained with applied power of 100 Watts. The deposition process was carried out for 3 hours. The DLN-coated silicon carbide particles appeared uniformly blue due to light interference effects of the uniform coating. If the coating were not uniform, multiple colors would be visible. The resulting abrasive grit displayed extreme hydrophobicity as shown by their ability to float on water. Uncoated particles immediately sank when placed in water.

Example 4

This example illustrates the preparation of DLN on oxide-coated phosphor particles wherein the particles are placed on a quartz frit placed directly above the planar electrode in a parallel plate plasma reactor. A spouted bed arrangement was used to agitate the particles.

A parallel plate reactor, materially as depicted in FIG. 2, was used for the deposition of DLN. The reactor comprised a 15.2 cm (6 in) inner diameter by 15.2 cm (6 in.) high aluminum tube closed on the top by an aluminum plate having pumping ports. On the bottom of this aluminum tube was an assembly of electrode, glass frit, and plastic insulation plate. The electrode was connected to an RF power supply through a matching network. Phosphor particles (400 grams, "Type 729") were placed onto the frit. The system was pumped down to a base pressure of 0.91 Pa (7 mTorr). Acetylene gas was introduced through an inlet beneath the glass frit and kept at a constant flow rate of 215 sccm. The chamber pressure was about 32.5 Pa (250 mTorr) and the temperature was initially 20° C. The plasma was ignited and increased to a sustained level of 150 Watts. DLN deposition was carried out for 10 minutes. The process yielded a DLN coating thickness estimated to be 20 to 100 nm (200 to 1000A) based on the intensity of the yellow color of the particles, which intensity increases with coating thickness. The resulting phosphor particles displayed similar properties to those of the particles produced by the method described in Example 1.

Other embodiments of the invention are within the scope of the following claims.

What is claimed is:

1. A method of depositing a diamond-like network onto particles comprising:

providing a capacitively coupled reactor system, comprising two electrodes in an evacuable reaction chamber;

placing a multiplicity of particles on or near one of the electrodes;

evacuating the chamber;

applying radio frequency power to one of the electrodes, and grounding the other electrode;

introducing a carbon-containing source into the reaction chamber thereby forming a plasma comprising reactive species in proximity to the multiplicity of particles and further forming ion sheaths around the electrodes;

agitating the multiplicity of particles in such a manner as to expose their surfaces to the reactive species in the plasma while keeping the particles substantially within an ion sheath so that depositing the diamond-like network onto the particles.

2. The method of claim 1 wherein the particles are subjected to the deposition method for a sufficient length of time to allow the diamond-like network to cover substantially the entire surface of the particles.

3. The method of claim 1 wherein the carbon-containing source is selected from the group consisting of carbon tetrafluoride and hydrocarbon gases selected from the group consisting of acetylene, methane, butadiene and mixtures of these.

4. The method of claim 1 wherein the agitating step comprises forming a spouted bed of the particles.

5. The method of claim 1 wherein the agitating step comprises vibrating a tray containing the multiplicity of particles.

6. The method of claim 1 further comprising introducing a source of additional components into the reaction chamber during or after the introduction of the carbon-containing source.

7. The method of claim 6 wherein the additional components comprise at least one of nitrogen, oxygen, fluorine, silicon, sulfur, titanium, and copper.

8. The method of claim 1 wherein the particles to be coated comprise one or more of organic materials and inorganic materials.

9. The method of claim 1 further comprising subjecting the particles to an argon/oxygen plasma prior to subjecting the particles to the plasma.

10. The method of claim 1 wherein one electrode is smaller than the other.

11. The method of claim 10 wherein the larger electrode is the chamber itself.

12. The method of claim 10 wherein the smaller electrode is the powered electrode.

13. The method of claim 12 wherein the particles are placed on the powered electrode.

14. The method of claim 1 wherein the particles to be coated comprise one or more of semiconductor materials and metals.

* * * * *